United States Patent
Rahman (10) Patent No.: US 8,933,345 B1
(45) Date of Patent: Jan. 13, 2015

(54) METHOD AND APPARATUS FOR MONITORING THROUGH-SILICON VIAS

(75) Inventor: Arifur Rahman, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 444 days.

(21) Appl. No.: 12/779,739

(22) Filed: May 13, 2010

(51) Int. Cl.
*H05K 1/11* (2006.01)

(52) U.S. Cl.
USPC .......................................... 174/262; 361/764

(58) Field of Classification Search
CPC ...... H01L 22/34; H01L 27/0203; H01L 27/12
USPC .......... 174/250–268; 361/767, 760, 737, 765, 361/764, 771; 257/48, E23.011, 686, 72
See application file for complete search history.

(56) References Cited

U.S. PATENT DOCUMENTS

| | | | | |
|---|---|---|---|---|
| 6,052,287 | A * | 4/2000 | Palmer et al. | 361/767 |
| 7,598,523 | B2 * | 10/2009 | Luo et al. | 257/48 |
| 7,733,661 | B2 * | 6/2010 | Kossives et al. | 361/760 |
| 2005/0263810 | A1 * | 12/2005 | Iizuka et al. | 257/296 |
| 2008/0073747 | A1 * | 3/2008 | Chao et al. | 257/520 |

* cited by examiner

*Primary Examiner* — Yuriy Semenenko (74) *Attorney, Agent, or Firm* — Scott Hewett; Gerald Chan (57) ABSTRACT

A silicon interposer has a plurality of conductive vias extending from a first side of a silicon substrate to an opposite side of the silicon substrate. A plurality of first side scan chain links are disposed on the first side of the silicon substrate. Each scan chain link electrically connects two conducting vias of the plurality of the conductive vias together. In some cases, a test fixture connects the opposite side of the conductive vias together and continuity or resistance is measured. In other cases, scan chain links are formed on the opposite side of the wafer to form a scan chain, which is electronically tested.

21 Claims, 5 Drawing Sheets

FIG. 6

METHOD AND APPARATUS FOR MONITORING THROUGH-SILICON VIAS

FIELD OF THE INVENTION

An embodiment of the invention relates generally to integrated circuits, and more particularly to techniques for fabricating silicon wafer with through vias.

BACKGROUND OF THE INVENTION

For a given node technology, increasing integrated circuit (IC) size typically increases the functionality that can be included on a chip. Unfortunately, defects often scale with chip area. A large chip is more likely to incorporate a defect than is a smaller chip. Defects affect yield, and yield loss often increases with increasing chip size. Various techniques have been developed to provide large ICs at desirable yield levels.

One approach to providing large ICs is to construct a large IC out of multiple smaller ICs (dice) on a silicon interposer. The silicon interposer is essentially a substrate that the dice are flip-chip bonded to after the silicon interposer has been processed to provide metal wiring and contacts. For example, a silicon wafer is fabricated to form one or more silicon interposers with several patterned metal layers and intervening insulating layers connected to vias, as are commonly called "back-end processing". Conventional conductive vias through the insulating layers connect the patterned metal layers together, and the dice are physically and electrically connected to the interposer with micro-bump arrays.

These patterned metal layers provide a high density interconnect pattern to the IC dice. A silicon interposer typically connects the fine-pitched dice to a coarser bump array on the opposite side of the interposer, which is then connected to a printed circuit board or package substrate. An interposer can also provide inter-chip and intra-chip connections, such as by connecting several ground pins of one or more chips on the interposer to a common ground of the interposer. Conductive through-silicon vias (TSVs) extend through the silicon interposer to electrically connect the patterned metal layers of the interposer to the opposite side of the silicon interposer, typically as a bump array.

The topside of the interposer often has tens of thousands of fine-pitch microbumps that will be flip-chip bonded to corresponding microbump arrays of the ICs bonded to the interposer. Direct testing of finished interposers is difficult because the closeness of the topside contacts makes them very difficult to probe. Detecting TSV failures after IC chip mounting is undesirable because of the added component and fabrication costs that are lost if a composite IC fails due to TSV failure.

Providing techniques for insuring TSV yield that avoid the disadvantages of the prior art are desirable.

SUMMARY OF THE INVENTION

An embodiment of an interposer includes a silicon substrate with a plurality of conductive vias extending from a first side of the silicon substrate to an opposite side of the silicon substrate. A plurality of first side scan chain links are disposed on the first side of the silicon substrate, and each scan chain link electrically connects two conducting vias of the plurality of the conductive vias together.

An embodiment of a test interposer wafer includes a silicon substrate and a plurality of through-silicon vias (TSVs) extending from a first side of the silicon substrate to a second side of the silicon substrate. A metal layer is disposed on the first side of the silicon substrate over first ends of the plurality of TSVs and electrically connects each of plurality of TSVs at their first ends.

An embodiment of a method to test through-silicon vias includes: forming through-silicon vias (TSVs) in a plurality of wafers in an interposer wafer lot. A first side metal layer is deposited on at least a test interposer wafer. The interposer test wafer is selected from the plurality of wafers, and the first side metal layer of the interposer test wafer is patterned to form first side scan chain links on the first side of the interposer test wafer. A scan chain formed from a first number of TSVs and a second number of topside scan chain links is electrically tested using a tester.

DETAILED DESCRIPTION

Figure 1A:
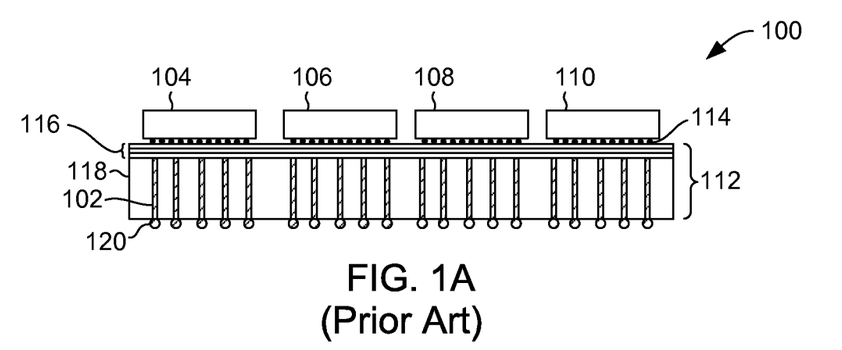
FIG. 1A is a cross section of a composite IC with TSVs.

FIG. 1A is a cross section of a composite IC 100 with TSVs 102. Four IC chips 104, 106, 108, 110 are mounted on an interposer 112. The IC chips 104, 106, 108, 110 are flip-chip bonded to the interposer 112, making electrical connection to the interposer 112 through conductive microbump arrays 114. For example, the IC chips are fabricated with C4 microbump arrays, which electrically and mechanically connect each IC chip to corresponding micro-contact arrays on the interposer. Other types of contacts, contact array, and bonding techniques are alternatively used. Other features and structures, such as underfill or moulding compound, are omitted for purposes of illustration.

The interposer 112 has patterned metal layers 116 fabricated on a silicon substrate 118. In a particular example, the silicon substrate 118 is a portion of a silicon wafer similar to those used in IC fabrication. The patterned metal layers 116 may be formed using deposition and photolithographic techniques similar to those used for IC fabrication. For example, if an IC fabrication process flow (e.g., a 90 nm node technology) defines several patterned metal layers on an IC wafer (commonly called the backend fabrication process), processes similar to those used to define the upper metal layers of the IC may be used to fabricate the patterned metal layers on the interposer wafer. Interposers typically have 1 to 4 patterned metal layers separated by intervening dielectric layers and interconnected using conductive vias, as is well known in the art of thin film, damascene or dual damascene processing.

The interposer 112 translates the fine-pitch of the IC contacts on the topside of the interposer to a less fine pitch on the backside. In particular examples, the topside of the interposer has about 20,000 to about 60,000 microbump contacts, and about 10,000 to about 30,000 TSVs, depending on the size of the composite IC, the number and type of ICs mounted on the interposer, and other factors. In a particular example, the microbumps are at a 45 micron pitch and the TSVs are bumped 120 to form a bump array having a pitch of about 150 microns to about 250 microns. Those of skill in the art of composite ICs appreciate that FIG. 1A is simplified for purposes of illustration, and specific dimensions and numbers are merely exemplary.

Figure 1B:
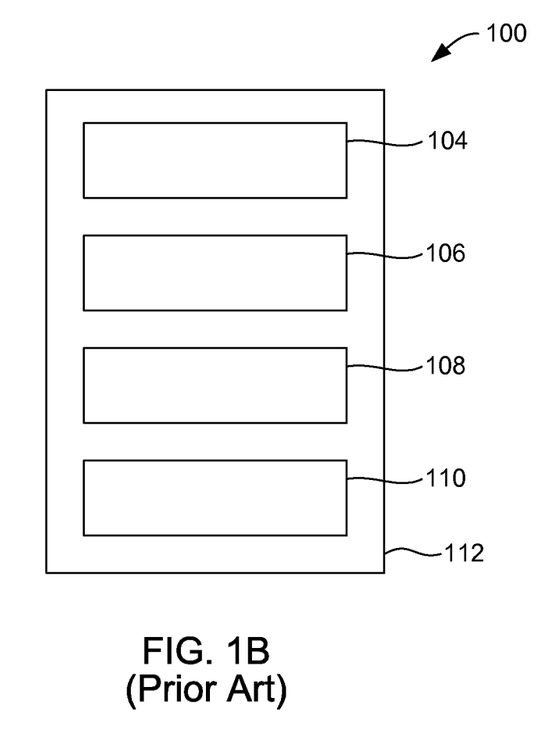
FIG. 1B is a plan view of the composite IC of FIG. 1A.

FIG. 1B is a plan view of the composite IC 100 of FIG. 1A. The IC chips 104, 106, 108, 110 are mounted on the interposer 112. In a particular embodiment, one or more of the IC chips is a field-programmable gate array (FPGA). For example, IC chip 106 is a master FPGA, and the other IC chips 104, 108, 110 are slave FPGAs. More or fewer IC chips are alternatively used, and different types of chips may be included in the composite IC. For example, chip 110 may be a memory chip, such as a RAM chip, a ROM chip, or a flash memory chip, or a processor chip, such as a microprocessor or a signal processor. The interposer 112 is passive, but provides inter- and intra-chip connectivity. For example, the interposer 112 includes a power distribution network that connects to one or more IC chips, or connects one signal port of an IC chip to another signal port of the IC chip, or to a signal port to one or more of the other IC chips.

Figure 2A:
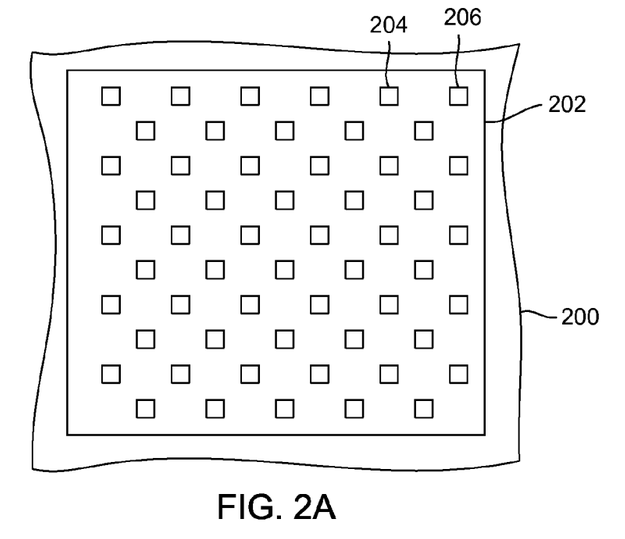
FIG. 2A is a plan view of a portion of an interposer wafer fabricated according to an embodiment.

FIG. 2A is a plan view of a portion of an interposer wafer 200 fabricated according to an embodiment. The interposer wafer 200 is a wafer in a lot of interposer wafers (e.g., a 25-wafer lot) that is removed for processing into an interposer test wafer. Generally, the lot of wafers is processed to a common point (e.g., TSV plating and first topside metal), the test wafer is pulled from the lot, and the remainder of the lot of interposer wafers is held pending the test results of the interposer test wafer. Each interposer wafer is patterned to form several interposer dies, such as interposer die 202. One or more embodiments of the invention can be used in passive or active interposers. Generally, a passive interposer has TSVs, patterned metal layers, and optionally passive electronic components, such as resistors or capacitors integrated in the interposer. An active interposer includes one or more active electronic components, such as a transistor switch or bias transistor.

In a particular embodiment, the interposer wafer is a silicon wafer, and TSVs 204, 206 have been formed through the silicon wafer. TSVs typically have a diameter of between about 10 microns and about 35 microns. The finished interposer wafer (after thinning) is typically about 100 microns thick. The TSVs are shown as being square; however, actual TSVs may appear round or other shape depending on the process being used and the size of the through-hole formed for the TSV. Generally, a directional etching technique, such as reactive ion etching, is used to form through-holes in the silicon wafer. A barrier oxide layer is formed for electrical isolation, and a seed layer is deposited on the walls of the through-holes. A plating process is used to deposit metal, such as copper, in the TSVs to form conductive vias from one side (e.g. topside) to the other side (e.g., bottom side) of the wafer. Other techniques are alternatively used to form the through-holes or to provide conductive material in the through-holes. The conductive material (e.g., plated copper) may form a tube of metal within the TSV or be essentially solid. TSVs are laid out in rows and columns to form an array of TSVs that will be bumped on the bottom side of the wafer (typically after wafer thinning and under bump metal (UBM) layer definition). The topside of the wafer is processed with one or more patterned metal layers (see, e.g., FIG. 1A, ref. num. 116) and contacts are provided to interface with microbump arrays on IC chips that will be mounted on finished composite ICs incorporating the interposer.

Figure 2B:
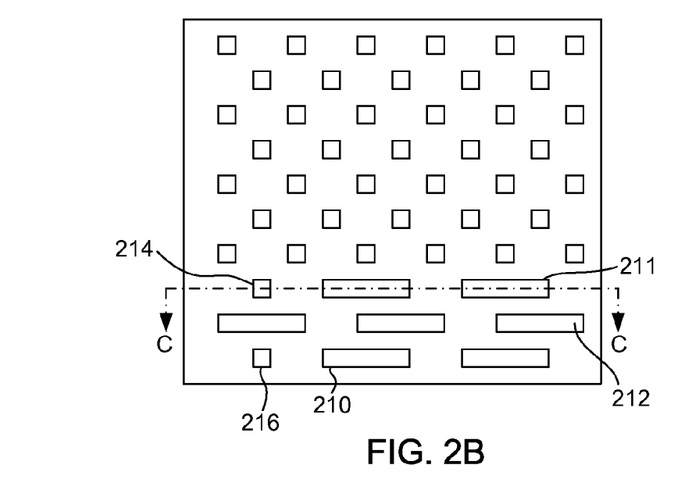
FIG. 2B is a plan view of the portion of the interposer wafer of FIG. 2A with scan chain metallization.

FIG. 2B is a plan view of the portion of the interposer wafer of FIG. 2A with scan chain metallization. The interposer die 202 is shown as being singulated from the wafer for simplicity of illustration. In an embodiment, the interposer dies are not singulated, and the interposer test wafer is evaluated; however, interposers are singulated from the wafer or the wafer is otherwise processed in alternative embodiments. A scan chain is a conductive structure of TSVs and scan chain links 210, 212 that connect TSVs together on the topside of the interposer wafer. The backside of the interposer wafer has backside scan chain links (see, e.g., FIG. 2C, ref. nums. 222, 224) or alternatively, backside scan chain continuity is provided by a test fixture or otherwise (see, e.g., FIG. 3). An electrically continuous path is established between TSV 214 and TSV 216, for example. In some embodiments, a topside and backside scan chain links connect each TSV in an interposer array with each other to form a scan chain that incorporates all TSVs in the interposer array. Alternatively, smaller scan chains are formed. In some embodiments, scan chains are formed in several interposer arrays on a wafer. For example, scan chains are formed in the upper, lower, left, right, and center portions of the wafer to test for run-out uniformity. In a particular embodiment, a scan chain in an interposer die has about ten thousand TSVs linked together and produces a resistance of about 100 Ohms. In exemplary embodiments, interposer wafers may have 50 scan chains to 5,000 scan chains. In an alternative embodiment, a test interposer wafer has at least five scan chains, one essentially in the center of the wafer and the other four essentially near the perimeter of the test interposer wafer forming the corners of a square.

In a particular embodiment, an interposer wafer will be divided into a number of interposer dies approximately 25 mm by 25 mm, with an interposer having a number of TSVs. A 300 mm silicon wafer produces about 90 interposer dies in an exemplary embodiment. In one embodiment, a scan chain incorporates all of the TSVs of an interposer die (e.g., if the finished interposer die will have 10,000 TSVs, a scan chain on the interposer die includes all 10,000 TSVs). Alternatively scan chains are formed from less than all TSVs in an interposer die. For example, a scan chain of 250 TSVs in a particular embodiment provides a resistance of about 25 ohms if all TSVs are good. Alternative embodiments use scan chains having about 200 TSVs to about 500 TSVs, which produces a suitably high scan chain resistance for discriminating between pass wafers and fail wafers. A typical contact probe resistance is about 100 milli-ohm, and scan chains having a sufficient number of TSVs (e.g., between 200-500 or more) to provide a resistance at least ten times greater than the contact resistance are desirable in some embodiments. Other embodiments use techniques, such as a four-point probe technique, to essentially remove the contact resistance from the TSV resistance measurement.

Figure 2C:
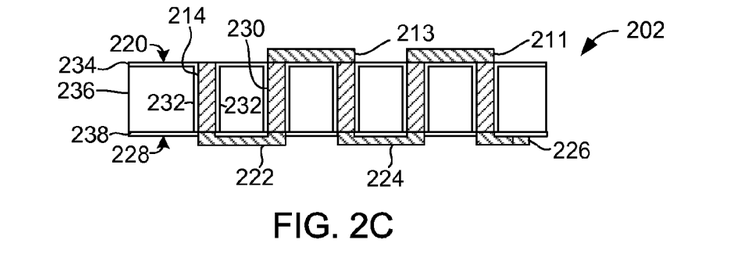
FIG. 2C is a cross section of a TSV test interposer taken across section line C-C of FIG. 2B.

FIG. 2C is a cross section of a TSV test interposer die 202 taken across section line C-C of FIG. 2B. Topside scan chain links 211, 213 are on the topside 220 of the interposer die 202 and backside chain links 222, 224, 226 are on the backside 228 of the interposer die 202. The scan chain links electrically connect TSVs in a scan chain (e.g., the scan chain between TSV 214 and TSV 216). For example, scan chain link 222 connects TSV 214 to TSV 230. Backside scan chain link 226 connects the TSVs in the top row of the scan chain (see, FIG. 2B ref. num. 211) with TSVs in the middle row, such as the endmost TSV beneath topside scan chain link 212 in FIG. 2B.

Thus, the topside and backside scan chain links form a scan chain with the TSVs connected together by the links.

The conductive TSVs and scan chain links are electrically isolated from the silicon wafer portion (silicon body) 236 of the TSV test interposer die 202 by dielectric material. For example, silicon oxide is grown from the silicon wafer portion 236 using a thermal process to form a dielectric liner layer 232 surrounding the conductive TSV 214 and a top dielectric layer 234, which electrically isolates the topside scan chain links 211, 213 from the silicon body. A backside dielectric layer 238 electrically isolates the backside scan chain links from the silicon body. In a particular embodiment, the backside dielectric layer is a deposited silicon oxide layer, which is used to keep the processing temperature of the TSV wafer low after the conductive TSVs have been formed. Electrically isolating the conductive elements of the scan chain from the silicon body avoids leakage currents between the scan chain elements and the silicon. In alternative embodiments, a silicon nitride, deposited silicon oxide, spun-on polymer or other dielectric material is used for the top dielectric layer.

Figure 3:
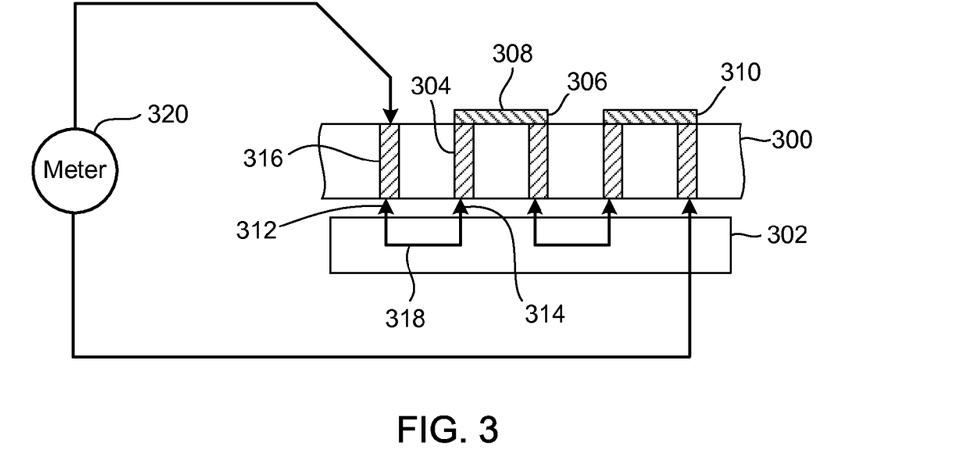
FIG. 3 is a cross section of a portion of a TSV test interposer wafer on a test fixture according to an alternative embodiment.

FIG. 3 is a cross section of a portion of a TSV test interposer wafer 300 on a test fixture 302 according to an alternative embodiment. Dielectric layers (see, FIG. 2, ref. nums. 232, 234, 238) isolating the conductive elements from the silicon body of the wafer have been omitted from FIG. 3 for clarity and simplicity of illustration. Alternatively the interposer wafer is a non-conductive wafer. The test interposer 300 has scan chain links 304, 306 on one side of the test interposer or test interposer wafer that electrically connect TSVs 308, 310 into a scan chain when the test interposer wafer 300 is placed on the test fixture 302.

The TSV wafer is typically mounted on a wafer carrier (not shown, typically a glass or silicon plate) using wax or mounting resin, for example. The wafer carrier provides mechanical support for the TSV wafer, which in some embodiments has been thinned to about 20-50 microns. Mounting a TSV wafer on a wafer carrier covers one side of the TSV wafer, leaving the opposite side exposed for testing. Thicker TSV wafers, such as 300 mm TSV wafers that are about 300 microns thick do not need to be mounted on a wafer carrier, and both sides may be available for testing, such as in a double-sided test fixture.

The test fixture 302 has contacts 312, 314 that electrically connect TSVs 304, 316 through connections 318 in the test fixture 302. In one embodiment, the test fixture has what is commonly referred to as a bed-of-nails contact array. The contacts are spring loaded or optionally rigid. One or more electrical characteristics of the scan chain are measured by a meter 320, such as an Ohm meter. The scan chain links 308, 310 are formed on the topside of a test interposer wafer from one of the metal layers used in production interposers, or on the backside of a test interposer wafer from a metal layer such as a metal layer used in an under-bump metal process.

Figure 4:
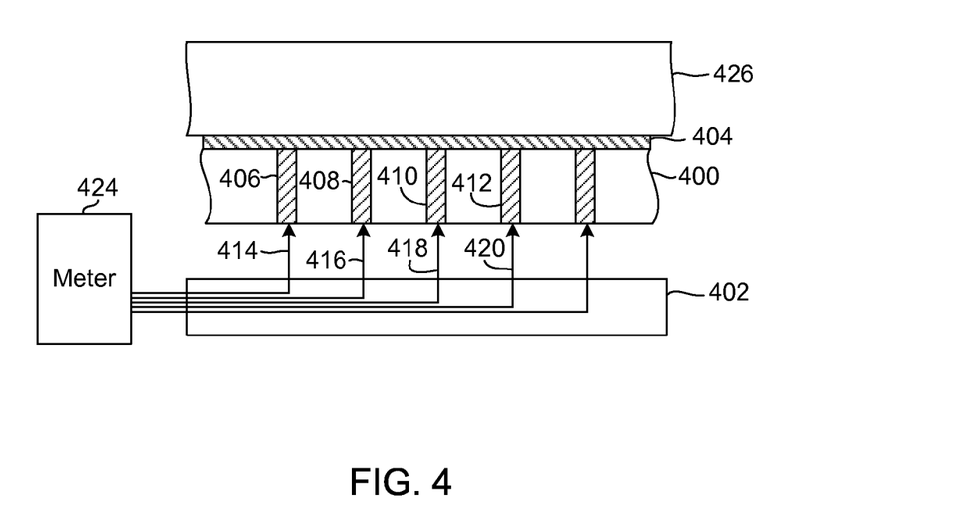
FIG. 4 is a diagram of a TSV test system according to an embodiment.

FIG. 4 is a cross section of a portion of a TSV test interposer wafer 400 on a test fixture 402 according to another embodiment. Dielectric layers (see, FIG. 2, ref. nums. 232, 234, 238) isolating the conductive elements from the silicon body of the wafer have been omitted from FIG. 4 for clarity and simplicity of illustration. One side of the test interposer wafer 400 has been metalized with a metal layer 404. The metal layer 404 shorts one end (i.e., the "top" end) of the TSVs 406, 408, 410, 412 together. Contacts 414, 416, 418, 420 in a test fixture 402 test pairs of TSVs (e.g., the continuity or resistance between TSV 406 and TSV 408). In a particular embodiment, a tester, which is a dedicated electronic test machine or system, or alternatively a general purpose computer-controlled test system configured to test TSV interposer wafers, allows a maximum number of 512 pins and 256 pairs of TSVs are tested.

In one embodiment, a meter 424 is calibrated to remove the probe and lead resistance between the meter 424 and the contact points with the TSVs. Pairs of contacts are measured for continuity or resistance. The TSV test interposer wafer 400 is mounted on a carrier 426 that supports the relatively thin TSV test interposer wafer and provides stiffness for the contact probes to press against. Tested pairs of TSVs can be adjacent, or distant. If a pair of TSVs fails test, each of the pair in the failed set can be tested with another (e.g., known good) TSV to differentiate which TSV in the pair failed. In some instances, it is possible that both TSVs in a tested pair fail.

Figure 5:
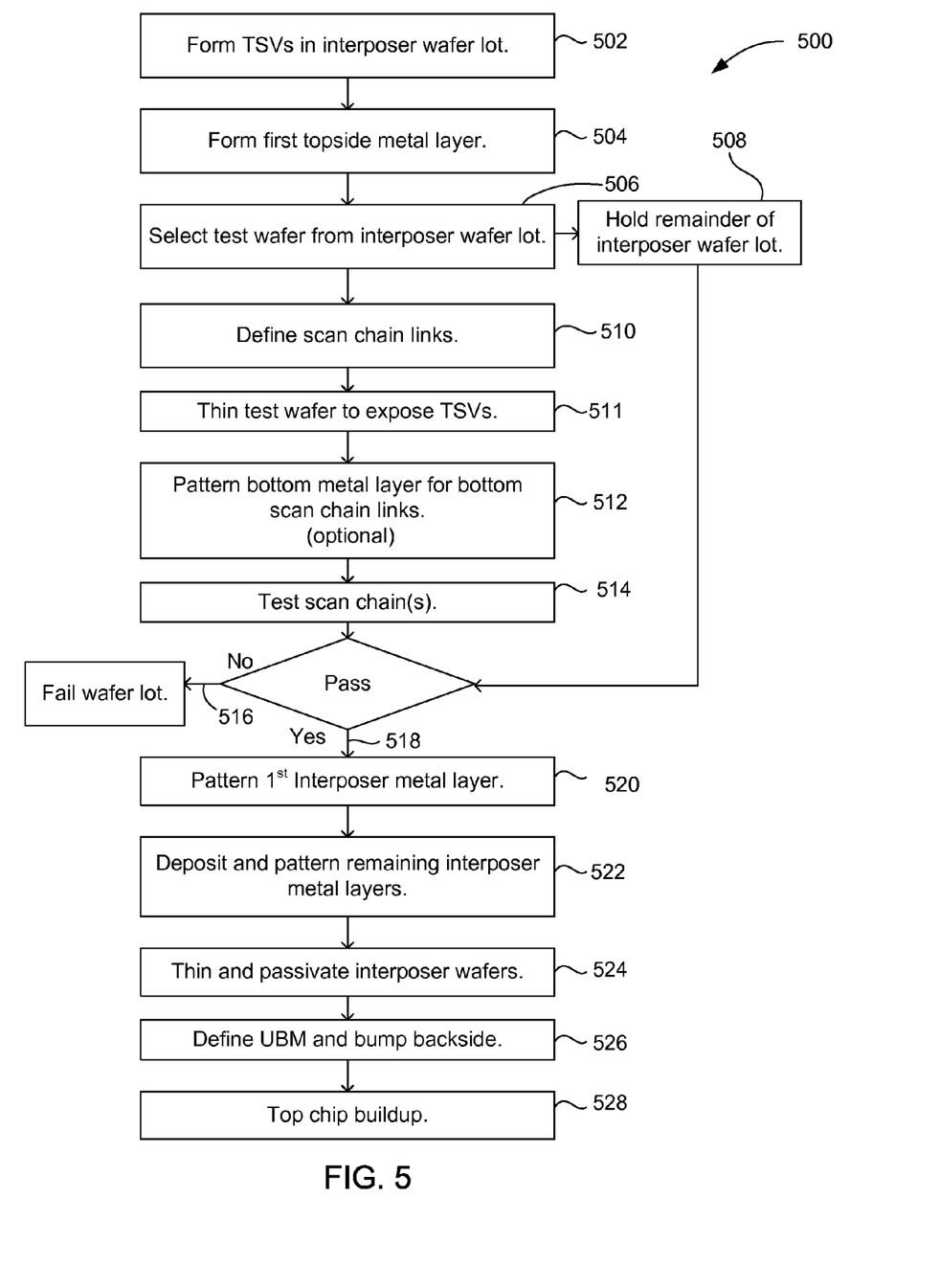
FIG. 5 is a flow chart of a method of testing interposers according to an embodiment.

FIG. 5 is a flow chart of a method of testing TSVs 500 according to an embodiment. TSVs are formed in wafers of an interposer wafer lot (step 502). In an exemplary embodiment, the interposer wafer lot is started with about twenty five silicon wafers. In an exemplary embodiment, a 300 mm silicon interposer wafer is patterned to have about ninety to about one hundred interposers that will eventually be singulated to provide interposers. Each interposer has between about five thousand and about forty thousand TSVs.

A topside inter-layer dielectric layer and first interposer metal layer is formed on the interposer wafer lot (step 504). In a particular embodiment, the first interposer metal layer is fabricated according to the design rules of the eighth metal layer (M8) in an eleven-metal layer IC fabrication process. As is well known in the art of back-end of line (BEOL) IC fabrication, different metal layers in a BEOL stack have different design rules, such as minimum and maximum feature dimensions, metal layer thickness, and so forth. Generally, the upper metal layers in a BEOL stack have larger features. Using the BEOL IC fabrication processes on the interposer wafers provides a highly robust interposer process and expected high yields in the interposer metal layer stack process.

An interposer test wafer is selected from the interposer wafer lot (step 506) and the remainder of the interposer wafer lot is held (step 508) pending the test results. In a particular embodiment, the interposer wafers are etched partially through using an isotropic etch technique to form TSV pockets. The TSV pockets are metalized to form conductors in the TSV pockets (e.g., by depositing a metal seed layer and then plating the TSV pockets with metal). In one process flow, the production wafers are held pending results of TSV testing, as the backend processing (e.g., forming multiple layers of patterned metal and intervening dielectric layers) is conveniently performed with thick (i.e., non back-lapped) wafers. Thinner backlapped wafers are more difficult to handle in the standard production tooling, and more prone to breakage. However, other process flows are used in alternative embodiments.

The topside metal layer, which is typically formed on a topside dielectric layer that isolates the metal from the silicon wafer, of the interposer test wafer is patterned to form topside scan chain links (step 510) connecting the tops of TSVs together. The interposer test wafer is backlapped (i.e., thinned) to remove silicon from the backside of the wafers to obtain the desired thickness (step 511) and to expose the metal conductors in the TSV pockets, which are now conductive TSVs.

A metal layer is formed on the backside of the wafer (typically over a backside dielectric layer) and backside scan chain links are optionally formed on the opposing side of the TSV wafer (step 512) to connect the TSVs and topside scan chain links in a serial fashion to form one or more scan chains. In a particular embodiment, a UBM process is used to form the backside scan chain links. The scan chain(s) is electrically tested (step 514) to determine continuity or resistance to monitor TSV process control. If the test interposer wafer fails scan chain test (branch 516), the interposer wafer lot is considered to have failed test, and the TSV process is evaluated to determine the cause of failure. If the test interposer wafer passes scan chain test (branch 518), the interposer wafer lot is further processed.

In an exemplary interposer wafer lot flow, the first metal layer on the topside is patterned (step 520), and the remaining metal layers (if any) and associated intervening inter-metal dielectric layers are deposited and patterned to form the interposer interconnect stack and the backside UBM pattern (step 522). The interposer wafers are optionally thinned (step 524), passivated (step 526) and bumped (step 528). IC chips are built up on the topside of the interposer in what is commonly referred to as a top-chip build-up process (step 530).

Figure 6:
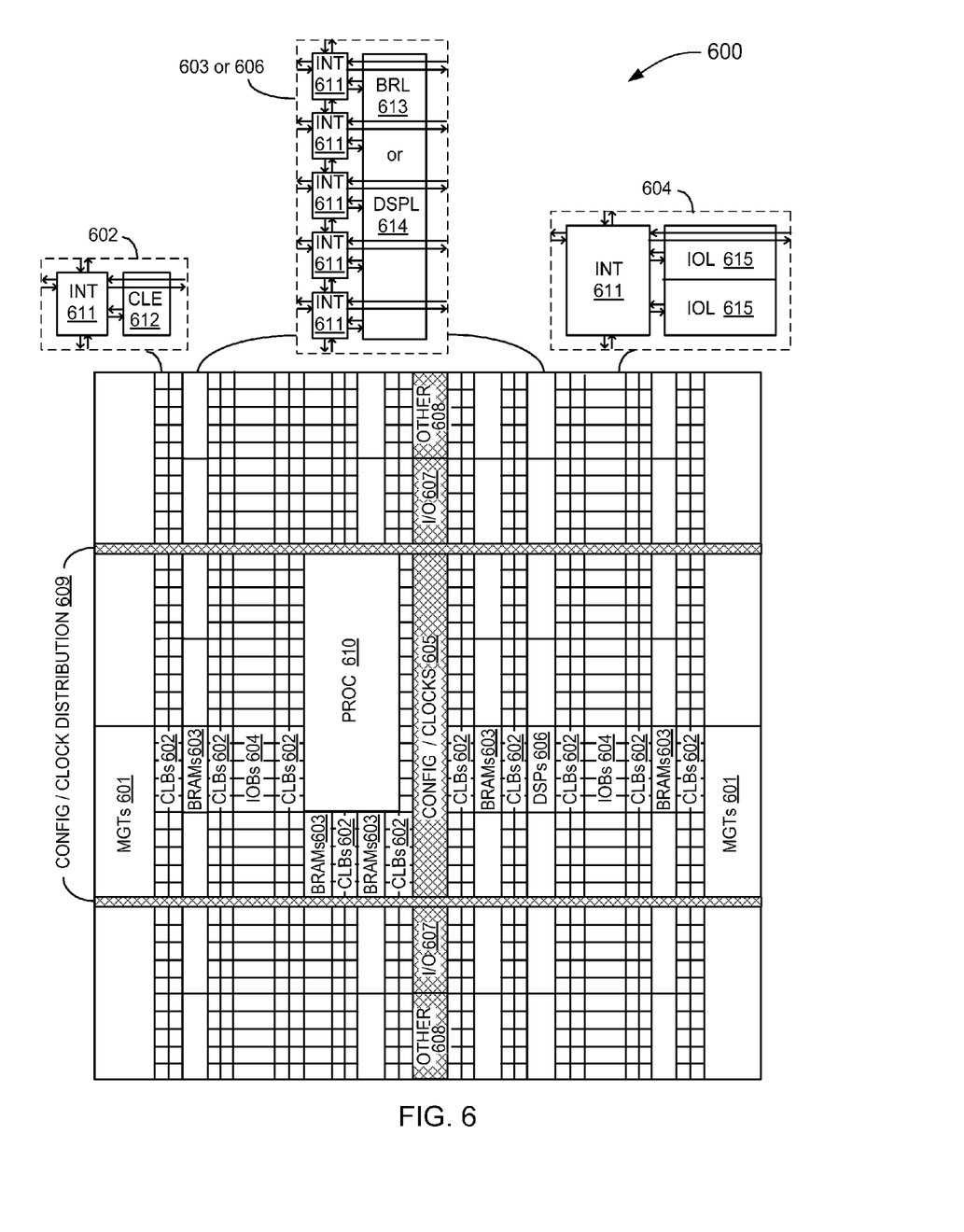
FIG. 6 is a plan view of a field programmable gate array suitable for use with one or more embodiments.

FIG. 6 is a plan view of an FPGA 600 suitable for use with one or more embodiments of the present invention. The FPGA is fabricated using a CMOS fabrication process or mixed CMOS/NMOS process.

The FPGA architecture includes a large number of different programmable tiles including multi-gigabit transceivers (MGTs) 601, configurable logic blocks (CLBs) 602, random access memory blocks (BRAMs) 603, input/output blocks (IOBs) 604, configuration and clocking logic (CONFIG/CLOCKS) 605, digital signal processing (DSP) blocks 606, specialized input/output blocks (I/O) 607 (e.g., configuration ports and clock ports), and other programmable logic 608 such as digital clock managers, analog-to-digital converters, system monitoring logic, and so forth. Some FPGAs also include dedicated processor blocks (PROC) 610. Horizontal areas 609 extending from the CONFIG/CLOCKS 605 column are used to distribute the clocks and configuration signals across the breadth of the FPGA 600.

In some FPGAs, each programmable tile includes a programmable interconnect element (INT) 611 having standardized connections to and from a corresponding interconnect element in each adjacent tile. Therefore, the programmable interconnect elements taken together implement the programmable interconnect structure for the illustrated FPGA. The programmable interconnect element (INT) 611 also includes the connections to and from the programmable logic element within the same tile, as shown by the examples included at the top of FIG. 6.

For example, a CLB 602 can include a configurable logic element (CLE 612) that can be programmed to implement user logic plus a single programmable interconnect element (INT) 611. A BRAM 603 can include a BRAM logic element (BRL) 613 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 606 can include a DSP logic element (DSPL) 614 in addition to an appropriate number of programmable interconnect elements. An IOB 604 can include, for example, two instances of an input/output logic element (IOL) 615 in addition to one instance of the programmable interconnect element (INT) 611. Some FPGAs utilizing the architecture illustrated in FIG. 6 include additional logic blocks that disrupt the regular columnar structure making up a large part of the FPGA. The additional logic blocks can be programmable blocks and/or dedicated logic. For example, the processor block PROC 610 shown in FIG. 6 spans several columns of CLBs and BRAMs. PROC 610 may comprise a single power domain or it may comprise multiple power domains or it may share a power domain with other blocks in FPGA 600.

Note that FIG. 6 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA more than one adjacent column of CLBs is typically included wherever the CLBs appear, to facilitate the efficient implementation of user logic.

While the present invention has been described in connection with specific embodiments, variations of these embodiments will be obvious to those of ordinary skill in the art. For example, alternative topside or backside metalizations could be used, or processing steps could be performed in a different order. Therefore, the spirit and scope of the appended claims should not be limited to the foregoing description.

What is claimed is:

1. An interposer comprising:
   a silicon substrate;
   a plurality of conductive vias extending from a first side of the silicon substrate to an opposite side of the silicon substrate;
   a plurality of first side scan chain links, each first side scan chain link electrically connecting two conducting vias of the plurality of the conductive vias together;
   a dielectric liner layer between one of the plurality of conductive vias and the silicon substrate; and
   a first side dielectric layer between one of the plurality of first side scan chain links and the silicon substrate, wherein the first side dielectric layer electrically isolates the one of the plurality of first side scan chain links from the silicon substrate while allowing the two conducting vias to electrically connect to each other;
   wherein the first side scan chain links are parts of a scan chain.

2. The interposer of claim 1 further comprising a plurality of opposite side scan chain links, each opposite side scan chain link electrically connecting two conducting vias of the plurality of the conductive vias together to form the scan chain comprising the plurality of first side scan chain links and the plurality of opposite side scan chain links.

3. The interposer of claim 2 wherein the scan chain includes at least 200 conductive vias.

4. The interposer of claim 2 wherein each conductive via of the interposer is incorporated in the scan chain.

5. A test interposer wafer incorporating the interposer in accordance with claim 1.

6. An interposer wafer lot including the test interposer wafer in accordance with claim 5.

7. A test interposer wafer incorporating the interposer of claim 2, wherein the interposer has at least fifty scan chains.

8. The interposer of claim 1 further comprising:
   an opposite side scan chain link; and
   an opposite side dielectric layer between the opposite side scan chain link and the substrate;
   wherein the first side dielectric layer and the opposite side scan chain link are on opposite sides of the silicon substrate.

9. The interposer of claim 1, wherein each first side scan chain link electrically connects the two conducting vias of the plurality of the conductive vias to the scan chain.

10. The interposer of claim 1, wherein the scan chain is configured for electrically coupling to a testing apparatus for testing a wafer that incorporates the interposer.

11. The test interposer wafer of claim 5, wherein the scan chain is configured for electrically coupling to a test apparatus for testing the test interposer wafer when the test interposer wafer is without any integrated circuit (IC) chip.

12. The interposer of claim 1, wherein the vias electrically connecting to the plurality of first side scan chain links comprises a subset of all available vias at the silicon substrate.

13. An interposer comprising:
a silicon substrate;
a plurality of conductive vias extending from a first side of the silicon substrate to an opposite side of the silicon substrate;
a scan chain link at the first side of the silicon substrate electrically connecting two or more conducting vias of the plurality of the conductive vias together;
a dielectric liner layer between one of the plurality of conductive vias and the silicon substrate; and
a first side dielectric layer between the scan chain link and the silicon substrate, wherein the first side dielectric layer electrically isolates the scan chain link and the silicon substrate while allowing the two or more conducting vias to electrically connect to each other;
wherein the scan chain link is a part of a scan chain.

14. The interposer of claim 13, wherein the scan chain link is electrically connecting more than two conducting vias of the plurality of the conductive vias together.

15. The interposer of claim 13, further comprising an additional scan chain link at the opposite side of the silicon substrate.

16. The interposer of claim 13, further comprising:
an opposite side scan chain link; and
an opposite side dielectric layer between the opposite side scan chain link and the substrate;
wherein the first side dielectric layer and the opposite side scan chain link are on opposite sides of the silicon substrate.

17. A method of testing through-silicon vias comprising:
providing an interposer having a silicon substrate, a plurality of conductive vias extending from a first side of the silicon substrate to an opposite side of the silicon substrate, a scan chain link at the first side of the silicon substrate electrically connecting two or more conducting vias of the plurality of the conductive vias together, a dielectric liner layer between one of the plurality of conductive vias and the silicon substrate, and a first side dielectric layer between the scan chain link and the silicon substrate, wherein the scan chain link is a part of a scan chain, and wherein the first side dielectric layer electrically isolates the scan chain link from the silicon substrate while allowing the two or more conducting vias to electrically connect to each other; and
electrically testing the scan chain.

18. The method of claim 17, wherein the silicon substrate is a part of a test interposer wafer.

19. The method of claim 17, wherein the act of electrically testing the scan chain comprises placing the silicon substrate in a test fixture including contacts and connections connecting the two conductive vias in the scan chain.

20. The method of claim 17, wherein the silicon substrate further has at least one second side scan chain link on the opposite side of the silicon substrate; and
wherein the scan chain is formed from the at least one first side scan chain link, the two conductive vias, and the at least one second side scan chain link.

21. The method of claim 17, wherein the act of electrically testing the scan chain includes measuring a resistance of at least twenty-five Ohms.

\* \* \* \* \*